(12) United States Patent
Sharon et al.

(10) Patent No.: US 8,504,890 B2
(45) Date of Patent: Aug. 6, 2013

(54) SCHEDULING FOR LDPC DECODING

(75) Inventors: Eran Sharon, Rishon le Zion (IL); Simon Litsyn, Givat Shmuel (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 1490 days.

(21) Appl. No.: 11/876,868

(22) Filed: Oct. 23, 2007

(65) Prior Publication Data

US 2008/0148128 A1 Jun. 19, 2008

Related U.S. Application Data

(60) Provisional application No. 60/870,396, filed on Dec. 17, 2006.

(51) Int. Cl.
*H03M 13/37* (2006.01)
*H03M 13/33* (2006.01)

(52) U.S. Cl.
USPC .......................................... 714/758; 714/764

(58) Field of Classification Search
None
See application file for complete search history.

(56) References Cited

U.S. PATENT DOCUMENTS

| | | | |
|---|---|---|---|
| 6,522,580 B2 | 2/2003 | Chen et al. | |
| 6,633,856 B2 | 10/2003 | Richardson et al. | |
| 6,957,375 B2 | 10/2005 | Richardson | |
| 6,961,888 B2 | 11/2005 | Jin et al. | |
| 6,963,622 B2 | 11/2005 | Eroz et al. | |
| 7,017,106 B2 | 3/2006 | Shen et al. | |
| 7,020,829 B2 | 3/2006 | Eroz et al. | |
| 7,089,479 B2 | 8/2006 | Matsumoto | |
| 7,107,511 B2 | 9/2006 | Shen et al. | |
| 7,120,856 B2 | 10/2006 | Zhang et al. | |
| 7,120,857 B2 | 10/2006 | Kim et al. | |
| 7,127,659 B2 | 10/2006 | Richardson et al. | |
| 7,133,853 B2 * | 11/2006 | Richardson et al. | 706/15 |
| 7,139,964 B2 | 11/2006 | Shen et al. | |
| 7,149,953 B2 | 12/2006 | Cameron et al. | |
| 7,159,170 B2 | 1/2007 | Shen et al. | |
| 7,174,495 B2 | 2/2007 | Boutillon et al. | |
| 7,181,676 B2 | 2/2007 | Hocevar | |
| 7,184,486 B1 | 2/2007 | Wu et al. | |
| 7,185,270 B2 | 2/2007 | Shen et al. | |
| 7,191,378 B2 | 3/2007 | Eroz et al. | |
| 7,203,887 B2 | 4/2007 | Eroz et al. | |
| 7,216,283 B2 | 5/2007 | Shen et al. | |
| 7,519,898 B2 * | 4/2009 | Narayanan et al. | 714/801 |
| 2002/0155866 A1 * | 10/2002 | Rainish et al. | 455/574 |
| 2004/0181733 A1 * | 9/2004 | Hilton et al. | 714/758 |
| 2005/0268204 A1 | 12/2005 | Harada | |

OTHER PUBLICATIONS

U.S. Appl. No. 11/642,708, filed Dec. 2006, Idan Alrod et al.

(Continued)

*Primary Examiner* — Ajay Bhatia
*Assistant Examiner* — Dipakkumar Gandhi
(74) *Attorney, Agent, or Firm* — Alston & Bird LLP

(57) ABSTRACT

A codeword is decoded by receiving a codeword representation that includes a plurality of soft bits and iteratively updating the soft bits. Whether each soft bit participates in at least some iterations is determined according to a selection criterion, e.g., probabilistically, or according to iteration number, or according to the soft bit's iteration history. For example, each soft bit might participate in some or all iterations with a probability that is a function of both the iteration number and a reliability measure of that soft bit. Preferably, the iterations are LDPC iterations in which variable nodes are addressed sequentially for exchanging messages with corresponding check nodes.

11 Claims, 7 Drawing Sheets

OTHER PUBLICATIONS

Efficient Serial Message-Passing Schedules for LDPC Decoding Eran Sharon Simon Litsyn School of Electrical Engineering Tel Aviv University Ramat Aviv 69978 Israel , Jacob Goldberger School of Engineering Bar Ilan University Ramat Gan 52900 Israel pp. 1-35 Apr. 5, 2007.

Low-Density Parity Check Code From Wikipedia the free Encyclopedia pp. 4-6 May 8, 2007.

LDPC Codes a Brief Tutorial Bernhard M.J. Leiner Apr. 8, 2005 pp. 1-9.

International Search Report for Application No. PCT/IL2007/001528 dated Apr. 1, 2008.

International Preliminary Report on Patentability for Application No. PCT/IL2007/001528 dated Jun. 23, 2009.

Written Opinion for Application No. PCT/IL2007/001528 (undated).

Office Action for Taiwan Application No. 096146533 dated Oct. 24, 2011.

Gallager, R. G., *Low-Density Parity-Check Codes,* MIT Press, 1963.

Guilloud, F., *Architecture Générique de Décodeur de Codes LDPC,* Thèse Présentée Pour Obtenir Le Grade De Docteur De L'école Nationale Supérieure Des Téléommunications (2004) 1-166.

Kim, D. H. et al., *Bit-Level Stopping of Turbo Decoding,* IEEE Commun. Letters No. 10 (2006) 183-185.

Levin, D. et al. *Lazy Scheduling for LDPC Decoding,* IEEE Communications Letters, vol. 11, No. 1 (2007) 70-72.

Nouh, A. et al., *Reliabity-Based Schedule for Bit-Flipping Decoding of Low-Density Parity-Check Codes,* IEEE Transactions on Communications, vol. 52, No. 12 (2004) 2038-2040.

Richardson, T. J. et al., *The Capacity of Low-Density Parity-Check Codes Under Message Passing Decoding,* IEEE Trans. on Info. Theory, vol. 47 (2001) 599-618.

Xiao, H. et al., *Graph-Based Message-Passing Schedules for Decoding LDPC Codes,* IEEE Transactions on Communications, vol. 52, No. 12 (2004) 2098-2105.

Yin, L. et al., *Modified Belief-Propagation Algorithm for Decoding of Irregular Low-Density Parity-Check Codes,* Electronics Letters, IEE Stevenage, GB vol. 28, No. 24, (2002) 1551-1553.

Zimmerman, E. et al., *Reduced Complexity LDPC Decoding Using Forced Convergence,* Proc., International Symposium on Wireless Personal Multimedia Communications, WPMC'04, Abano Terme, Italy, (2004) 1-4.

* cited by examiner

SCHEDULING FOR LDPC DECODING

This patent application claims the benefit of U.S. Provisional Patent Application No. 60/870,396, filed Dec. 17, 2006

FIELD AND BACKGROUND OF THE INVENTION

The present invention relates to decoding of codewords and, more particularly, to a LDPC decoding method that uses serial updating of the messages of only selected is nodes in each iteration.

Low-density parity check (LDPC) codes are a class of linear block codes. The name "LDPC" comes from the fact that the parity-check matrices of these codes have many more zeros than ones. The main advantages of LDPC codes are that they provide a performance that is very close to capacity for many different channels, that their decoding algorithms have linear complexity in time, and that they are suited for implementations that make heavy use of parallelism.

LDPC codes were first introduced by R. G. Gallager in 1960 in his PhD thesis. Due to the computational effort required to implement LDPC coders and decoders, and due to the introduction of Reed-Solomon codes, LDPC codes were generally ignored until the mid-1990s.

LDPC codes may be represented either as matrices or graphically.

The following matrix is an example of a m×n parity check matrix for a (8,4) code (m=4, n=8):

$$H = \begin{pmatrix} 0 & 1 & 0 & 1 & 1 & 0 & 0 & 0 \\ 1 & 1 & 1 & 0 & 0 & 1 & 0 & 0 \\ 0 & 0 & 1 & 0 & 0 & 1 & 1 & 1 \\ 1 & 0 & 0 & 1 & 1 & 0 & 1 & 0 \end{pmatrix}$$

Two numbers describe such matrices: $w_r$, the number of ones in a row, and $w_c$, the number of ones in a column. For such a matrix to be "low density", $w_r$ must be much less than m and $w_c$ must be much less than n. This is not the case in the above example but it is the case in the much larger parity check matrices that are used in practice.

In 1981, Tanner introduced an effective graphical representation of LDPC codes. These graphs both provide a complete representation of such codes and also help to describe decoding algorithms.

A Tanner graph is a "bipartite" graph. This means that the nodes of the graph are separated into two distinct sets and that the edges of the graph connect nodes of different types. The two types of nodes in a Tanner graph are the variable nodes (or v-nodes) and the check nodes (or c-nodes).

FIG. 1 shows a Tanner graph that represents the same code as the above matrix. The graph has m check nodes (m is the number of parity bits) and n variable nodes (n is the number of bits in a codeword). Check node f is connected to variable node $c_1$ if the element $h_{ij}$ of H is a one.

A LDPC code is called "regular" if every column has the same number of ones ($w_c$ constant) and every row has the same number of ones ($w_r$ constant). The matrix above is regular with $w_c=2$ and $w_r=4$. The regularity of this code also is evident in FIG. 1: every v-node has the same number of incoming edges and every c-node has the same number of incoming edges. If a parity check matrix is low density but the number of ones in each row or column is not constant the code is called an "irregular" LDPC code.

The basic algorithm used to decode LDPC codes was discovered independently several times and is called by different names. The most common names are "belief propagation algorithm", "message passing algorithm" and "sum-product algorithm".

The algorithm assumes that estimates of the bits of the codeword to be decoded are provided in the form of log-likelihood-ratios (LLRs)

$$P_i = \log\left(\frac{Pr(\text{bit } i = 0)}{Pr(\text{bit } i = 1)}\right).$$

These LLR estimates can be computed e.g. based on symbols received from a noisy channel. At the end of every iteration, the current estimate of the LLR of the i-th bit is denoted $Q_i$. The message sent by variable node $c_i$ to check node $f_j$ is denoted $Q_{ij}$. The message sent by check node $f_j$ to variable node $c_i$ is denoted $R_{ji}$. Initially, for all i and j, $Q_{ij}=P_i$ and $R_{ji}=0$. In each iteration the messages are computed according to the following updating rules:

$$Q_{ij} \leftarrow P_i + \sum_{j' \in N(i) \setminus j} R_{j'i}$$

$$R_{ji} \leftarrow \varphi^{-1}\left(\sum_{i' \in N(j) \setminus i} \varphi(Q_{i'j})\right)$$

$$Q_i \leftarrow P_i + \sum_{j \in N(j)} R_{ji}$$

where N(k) denotes the set of neighbors of a node k, i.e., in the case of k=i, all the check nodes $f_j$ that send messages to a given variable node $c_i$, and in the case of k=j, all the variable nodes $c_i$ that send messages to a given check node $f_j$; and $$\varphi(x) = \left(\text{sign}(x), -\log\tanh\left(\frac{|x|}{2}\right)\right)$$

$$\varphi^{-1}(x) = (-1)^{sign}\left(-\log\tanh\left(\frac{x}{2}\right)\right)$$

Note that φ(x) and its computations are defined over a group F2×[0,∞]. If the message sent by variable node $c_i$ to check node $f_j$ is re-defined as $T_{ij}=\phi(Q_{ij})$, symmetric updating rules can be expressed as follows.

$$T_{ji} \leftarrow \varphi\left(P_i + \sum_{j' \in N(i) \setminus j} R_{j'i}\right)$$

$$R_{ji} \leftarrow \varphi^{-1}\left(\sum_{i' \in N(j) \setminus i} T_{i'j}\right)$$

The order of passing messages among the nodes is referred to as a message passing decoding schedule. The conventional message-passing schedule is the "flooding" schedule (R. C. Gallager, *Low-Density Parity-Check Codes*, MIT Press, 1963), in which, in each iteration, first all the variable nodes pass new messages to their neighbors, and then all the check nodes pass new messages to their neighbors. A serial schedule in which an iteration is performed by serially traversing the variable nodes and for each one updating its incoming and outgoing messages was shown in E. Sharon, S. Litsyn and J. Goldberger, "Efficient serial message-passing schedules for LDPC decoding", *Proc. Turbo-Coding-2006 Conference*, Munich, April 2006, to converge approximately twice as fast as the flooding schedule.

The following U.S. patents are representative of the state of the art in LDPC encoding and decoding:

U.S. Pat. No. 7,089,479 to Matsumoto
U.S. Pat. No. 7,107,511 to Shen et al.
U.S. Pat. No. 7,120,857 to Kim et al.
U.S. Pat. No. 7,127,659 to Richardson et al.
U.S. Pat. No. 7,133,853 to Richardson et al.
U.S. Pat. No. 7,149,953 to Cameron et al.
U.S. Pat. No. 7,174,495 to Boutillon et al.
U.S. Pat. No. 7,181,676 to Hocevar All of these patents are incorporated by reference for all purposes as if fully set forth herein.

SUMMARY OF THE INVENTION

The basis of the present invention is an innovative variant of the serial schedule, referred to herein as the lazy schedule (LS), which provides additional reduction in the decoding computational complexity by selectively updating only variable nodes that are more likely to be misperceived in an iteration.

The decoding process usually achieves high confidence in the estimation of most of the variable nodes after very few iterations. These nodes are not likely to change polarity in the consequent decoding iterations. LS exploits this phenomenon by decoding through partial iterations, updating only the less reliable messages.

We measure the decoding complexity as the total number of messages that are computed up to convergence. Hence, if LS does not increase the number of iterations needed for convergence by much, it has a potential to reduce the overall decoding complexity by reducing the complexity per iteration. Clearly, it is also important that LS not degrade the Bit Error Rate (BER) performance of the decoder or cause an artificial error floor (Dong Ho Kim and Sang Wu Kim, "Bit-level stopping of turbo decoding", *IEEE Commun. Letters* no. 10 pp. 183-185, 2006). Indeed, as shown below, a carefully designed and optimized lazy schedule reduces the decoding complexity without performance degradation.

According to the present invention there is provided a method of decoding a codeword, including the steps of: (a) receiving a representation of the codeword from a channel, the representation including a plurality of soft bits; and (b) in each of at least one decoding iteration: (i) for each soft bit: deciding in accordance with a selection criterion whether the each soft bit is to participate in the each decoding iteration, and (ii) if the deciding has selected at least one soft bit to participate in the each decoding iteration: updating the at least one participating soft bit.

According to the present invention there is provided a method of decoding a codeword, including the steps of: (a) receiving a representation of the codeword from a channel, the representation including a plurality of soft bits; (b) in each of at least one decoding iteration, sequentially updating at least a portion of the soft bits; wherein, in one decoding iteration, only a portion of the soft bits is updated.

According to the present invention there is provided a method of decoding a codeword, including the steps of: (a) receiving a representation of the codeword from a channel, the representation including a plurality of soft bits; and (b) in each of at least one decoding iteration: (i) for each soft bit: deciding, in accordance with a selection criterion, an extent to which the each soft bit is to participate in the each decoding iteration, and (ii) if the deciding has selected the at least one soft bit to participate in the each decoding iteration: updating the at least one participating soft bit.

According to the present invention there is provided a decoder for decoding a codeword representation that includes a plurality of soft bits, the decoder including: a plurality of functional modules for updating the soft bits in at least one decoding iteration, it being decided in accordance with a selection criterion, in each decoding iteration, for each soft bit, whether the each soft bit participates in the each decoding iteration.

According to the present invention there is provided a decoder for decoding a codeword representation that includes a plurality of soft bits, the decoder including a plurality of functional modules for sequentially updating at least a portion of the soft bits in each of at least one decoding iteration, wherein, in one decoding iteration, only a portion of the soft bits is updated.

According to the present invention there is provided a decoder for decoding a codeword representation that includes a plurality of soft bits, the decoder including a plurality of functional modules for updating the soft bits in at least one decoding iteration, it being decided in accordance with a selection criterion, in each decoding iteration, for each soft bit, an extent to which the each soft bit is to participate in the each decoding iteration.

According to the present invention there is provided a memory including: (a) an array of nonvolatile memory cells for storing a codeword; and (b) circuitry for decoding a representation of the codeword received from the array of nonvolatile memory cells, the representation including a plurality of soft bits, by updating the soft bits in at least one decoding iteration, it being decided in accordance with a selection criterion, in each decoding iteration, for each soft bit, whether the each soft bit participates in the each decoding iteration.

According to the present invention there is provided a memory including: (a) an array of nonvolatile memory cells for storing a codeword; and (b) circuitry for decoding a representation of the codeword received from the array of nonvolatile memory cells, the representation including a plurality of soft bits, by steps including sequentially updating at least a portion of the soft bits in each of at least one decoding iteration, wherein, in one decoding iteration, only a portion of the soft bits is updated.

According to the present invention there is provided a memory including: (a) an array of nonvolatile memory cells for storing a codeword; and (b) circuitry for decoding a representation of the codeword received from the array of nonvolatile memory cells, the representation including a plurality of soft bits, by updating the soft bits in at least one decoding iteration, it being decided in accordance with a selection criterion, in each decoding iteration, for each soft bit, an extent to which the each soft bit participates in the each decoding iteration.

According to the present invention there is provided a memory device, including: (a) a nonvolatile memory for storing a codeword; and (b) a controller operative to receive a representation of the codeword from the nonvolatile memory, the representation including a plurality of soft bits, and to decode the representation of the codeword by updating the soft bits in at least one decoding iteration, it being decided in accordance with a selection criterion, in each decoding iteration, for each soft bit, whether the each soft bit participates in the decoding iteration.

According to the present invention there is provided a memory device, including: (a) a nonvolatile memory for storing a codeword; and (b) a controller operative to receive a representation of the codeword from the nonvolatile memory, the representation including a plurality of soft bits, and to decode the representation of the codeword by steps including: sequentially updating at least a portion of the soft bits in each of at least one decoding iteration, wherein, in one decoding iteration, only a portion of the soft bits is updated.

According to the present invention there is provided a memory device, including: (a) a nonvolatile memory for storing a codeword; and (b) a controller operative to receive a representation of the codeword from the nonvolatile memory, the representation including a plurality of soft bits, and to decode the representation of the codeword in at least one decoding iteration, it being decided in accordance with a selection criterion, in each decoding iteration, for each soft bit, an extent to which the each soft bit participates in the each decoding iteration.

According to the present invention there is provided a system including: (a) a memory device; and (b) a host, of the memory device, that is operative to receive a representation of a codeword from the memory device, the representation including a plurality of soft bits, and to decode the representation of the codeword by updating the soft bits in at least one decoding iteration, it being decided in accordance with a selection criterion, in each decoding iteration, for each soft bit, whether the each soft bit participates in the each decoding iteration.

According to the present invention there is provided a system including: (a) a memory device; and (b) a host, of the memory device, that is operative to receive a representation of a codeword from the memory device, the representation including a plurality of soft bits, and to decode the representation of the codeword by steps including sequentially updating at least a portion of the soft bits in each of at least one decoding iteration, wherein, in one decoding iteration, only a portion of the soft bits is updated.

According to the present invention there is provided a system including: (a) a memory device; and (b) a host, of the memory device, that is operative to receive a representation of a codeword from the memory device, the representation including a plurality of soft bits, and to decode the representation of the codeword by updating the soft bits in at least one decoding iteration, it being decided in accordance with a selection criterion, in each decoding iteration, for each soft bit, an extent to which the each soft bit participates in the each decoding iteration.

According to the present invention there is provided a computer-readable storage medium having computer-readable code embodied thereon, the computer-readable code for decoding a representation of a codeword, the representation including a plurality of soft bits, the computer-readable code including: (a) program code for updating the soft bits in at least one decoding iteration, it being decided according to a selection criterion, in each decoding iteration, for each soft bit, whether the each soft bit participates in the each decoding iteration.

According to the present invention there is provided a computer-readable storage medium having computer-readable code embodied thereon, the computer-readable code for decoding a representation of a codeword, the representation including a plurality of soft bits, the computer-readable code including: (a) program code for decoding the representation of the codeword by steps including sequentially updating at least a portion of the soft bits in each of at least one decoding iteration, wherein, in one decoding iteration, only a portion of the soft bits is updated.

According to the present invention there is provided a computer-readable storage medium having computer-readable code embodied thereon, the computer-readable code for decoding a representation of a codeword, the representation including a plurality of soft bits, the computer-readable code including: (a) program code for updating the soft bits in at least one decoding iteration, it being decided according to a selection criterion, in each decoding iteration, for each soft bit, an extent to which the each soft bit participates in the each decoding iterations.

The methods of the present invention are methods of decoding a codeword. A representation of the codeword is received from a channel. A "channel" is a physical source of the plurality of soft bits that constitutes the representation of the codeword. For example, in a communication system, the channel to a decoder includes the medium via which a signal that includes the codeword is transmitted to a receiver that includes the decoder, plus whatever hardware, such as demodulation hardware, the receiver includes to receive the signal and to provide the soft bits of the codeword representation to the decoder. Such a channel is called a "communication channel" herein. In a memory device, the channel to a decoder includes the storage hardware (e.g. an array of flash memory cells) in which the codeword is stored, plus the circuitry that reads the soft bits of the codeword representation from the storage hardware and provides the soft bits to the decoder. Such a channel is called a "memory channel" herein. What the decoder receives, and what the methods of the present invention operate on, is only a "representation" of the codeword, and not, e.g., the codeword originally transmitted in the communication system or the codeword originally stored in the storage hardware of the memory device, because the channel is noisy.

A "soft bit" is an estimate of the value of a bit combined with a reliability measure of the estimate. Often, the same number serves as both the estimate of the value of the bit and the reliability measure. For example, the sign of a LLR is an estimate of the value of the bit represented by the LLR and the magnitude of a LLR is a measure of the reliability of that estimate.

In a first basic method of the present invention, the codeword is decoded iteratively, in one or more decoding iterations. In each decoding iteration, for each soft bit, it is decided in accordance with a selection criterion whether that soft bit is to participate in this decoding iteration. Then, all the soft bits that have been selected to participate in this decoding iteration are updated.

It is possible, and usually is the case, that not all the soft bits participate in every decoding iteration. It also is possible in a specific case that all the soft bits turn out to have been selected to participate in every decoding iteration. In such a case, the feature of the present invention that distinguishes the present invention from prior art methods in which all the soft bits always participate is that a selection criterion was examined to determine whether the soft bits participate: a priori, there was no guarantee that all the soft bits would participate in every decoding iteration of the present invention. One convergence criterion of the present invention is that a decoding iteration is reached in which no soft bits are selected to participate.

Preferably, the decoding iterations are LDPC iterations. Each soft bit is assigned to a respective variable node, so that, in each decoding iteration, it is decided in accordance with the selection criterion, for each variable node, whether that variable node participates in this decoding iteration. In each decoding iteration, each participating variable node receives, from each member of a respective subplurality of a plurality of check nodes, a respective check-node-to-variable-node message. Each participating variable node updates its respective soft bit in accordance with the check-node-to-variablenode messages that that variable node has most recently received from its subplurality of check nodes. Each participating variable node also passes, to all the check nodes in its subplurality, a respective variable-node-to-check-node message.

Preferably, the selection criterion is a probabilistic selection criterion. In other words, the decision of whether a soft bit participates is done by a non-deterministic process. For example, in some preferred embodiments of the present invention, for each soft bit, a random number is generated and the soft bit participates in the decoding iteration only if some function of a reliability measure of the soft bit is less than that random number. Thus, in the same decoding iteration of two different applications of the same specific embodiment of the method of the present invention to the same input codeword, the set of soft bits that participate in the first application could be different from the set of soft bits that participate in the second application. This feature of the present invention is one of the features that distinguish the algorithms of the present invention from prior art deterministic algorithms such as the forced convergence algorithm.

More preferably, each soft bit participates in each decoding iteration with a probability that is a function of a reliability measure of the soft bit, such as an absolute value of the soft bit, at the start of that decoding iteration. Still more preferably, the method includes optimizing the function. Most preferably, the function is optimized by steps including simulating the updating in all the decoding iterations using a plurality of trial functions and choosing, as the function to use, the trial function that minimizes a decoding complexity of the updating.

Alternatively, each soft bit participates in each decoding iteration with a probability that is a function of a reliability measure of the soft bit, such as an absolute value of the soft bit, as received from the channel. Still more preferably, the method includes optimizing the function. Most preferably, the function is optimized using a density evolution algorithm.

Alternatively, each soft bit participates in each decoding iteration with a probability that is a function of the iteration serial number of the current decoding iteration. Alternatively, each soft bit participates in each decoding iteration with a probability that is a function of the participation history of that soft bit. The "participation history" of a soft bit is a record of when, or how often, that soft bit has participated in the decoding. For example, the argument of the function could include how many decoding iterations have elapsed since the last decoding iteration in which the soft bit participated, or how long it has been, as measured by the system clock, since the last decoding iteration in which the soft bit participated. Generally, the argument of the function includes more than just the iteration serial number and/or the participation history. If the argument of the function is limited to just the iteration serial number and/or the participation history then normally all the soft bits participate in the first iteration.

The selection criterion need not be probabilistic. Preferred deterministic selection criteria include a function of a serial number of the current decoding iteration and a function of the participation history of the soft bit for which a participation decision is being rendered.

In a second basic method of the present invention, the soft bits are updated iteratively. In each of one or more decoding iterations, at least some of the soft bits are updated sequentially. That the soft bits are updated "sequentially" means that all the operations of a given decoding iteration for updating one soft bit are completed before proceeding to the next soft bit. This is one feature of the present invention that distinguishes this aspect of the present invention from the prior art flooding schedule, and hence from prior art algorithms, such as the forced convergence algorithm, that use a flooding schedule. In one of the decoding iterations, not all the soft bits are updated. This is one feature of the present invention that distinguishes this aspect of the present invention from the prior art of Sharon et al.

Preferably, the decoding iterations are LDPC iterations. Before commencing the iterations, each soft bit is assigned to a respective variable node. In each decoding iteration, for each participating soft bit, a respective check-node-to-variable-node message is passed, to the variable node to which that soft bit has been assigned, from each member of a respective subplurality of a plurality of check nodes. Then, that soft bit is updated in accordance with the check-node-to-variable-node messages most recently received by that variable node from its respective subplurality of check nodes. Then, a respective variable-node-to-check-node message is passed from that variable node to each of its respective check nodes. All of these operations are completed before proceeding to the next soft bit and its assigned variable node.

In a third basic method of the present invention, the codeword is decoded iteratively, in one or more decoding iterations. In each decoding iteration, for each soft bit, it is decided, in accordance with a selection criterion, the extent (fully, partially or not at all) to which that soft bit is to participate in this decoding iteration. Then, all the soft bits that have been selected to participate in this decoding iteration are updated.

As in the first method of the present invention, the selection criterion may be probabilistic, or a function of the iteration serial number of the current decoding iteration, or a function of the participation history of the soft bit whose participation extent is being determined.

Preferably, the decoding iterations are modified LDPC decoding iterations that use a directed Tanner graph. Each soft bit is assigned to a respective variable node of the directed Tanner graph. In each decoding iteration, for each edge of the directed Tanner graph, it is decided, in accordance with the selection criterion, whether that edge is to participate in the current decoding iteration. If the edge participates in the current decoding iteration, it does so by having a message passed along that edge that is related to the soft bit that has been assigned to the variable node of that edge. Note that although the extent to which a soft bit participates in a given decoding iteration may be full, partial or not-at-all, depending on how many of the edges of that variable node participate in the decoding iteration, each edge of the directed Tanner graph participates in a given decoding iteration either fully or not at all. Most preferably, in one of the decoding iterations, at least one of the variable node edges participates after at least one of the check node edges. Also most preferably, in one of the decoding iterations, two of the messages are passed in parallel.

A decoder of the present invention includes a plurality of functional modules for implementing one of the methods of the present invention. For example, a probabilistic LDPC embodiment of the decoder includes a variable node assignment module, a variable node selection module, first and second message passing modules and a soft bit update module. The variable node assignment module assigns each soft bit to a respective variable node so that it is decided according to a selection criterion, for each variable node, whether that variable node participates in each decoding iteration. The variable node selection module determines which variable nodes participate in each decoding iteration. In each decoding iteration, the first message passing module computes, for each participating variable node, for each member of a respective subplurality of a plurality of check nodes, a respective check-node-to-variable-node message, the soft bit update module updates the respective soft bit of each participating variable node in accordance with the check-node-to-variable-node messages received in this deciding iteration from the second message passing module; and the second message passing module computes, for each participating variable node, according to the check-node-to-variable-node messages that that participating variable node has received most recently from the first message passing module, a respective variable-node-to-check-node message for each check node in the respective subplurality of check nodes of that participating variable node.

Preferably, the plurality of functional modules includes a convergence check module for deciding, responsive to the updating, whether the decoding has converged.

The scope of the present invention also includes a communication receiver that includes a demodulator for demodulating a message received from a channel thereby providing a codeword representation that includes a plurality of soft bits, and a decoder of the present invention for decoding the codeword representation. The scope of the present invention also includes a communication system that includes a communication receiver of the present invention, the channel, and a transmitter for transmitting the message to the communication receiver via the channel. FIG. 2, that is adapted from FIG. 27 of Matsumoto, U.S. Pat. No. 7,089,479, is a high-level schematic block diagram of such a communication system 100 that includes a transmitter 110, a channel 103 and a receiver 112. Transmitter 110 includes an encoder 101 and a modulator 102. Receiver 112 includes a demodulator 104 and a decoder 105. Encoder 101 receives a message and generates a corresponding codeword. Modulator 102 subjects the generated codeword to a digital modulation such as BPSK, QPSK or multi-valued QAM and transmits the resulting modulated signal to receiver 112 via channel 103. At receiver 112, demodulator 104 receives the modulated signal from channel 103 and subjects the received modulated signal to a digital demodulation such as BPSK, QPSK or multi-valued QAM. Decoder 105 decodes the resulting representation of the original codeword using one of the methods of the present invention.

The scope of the present invention also includes a memory device that includes a memory, circuitry for storing data in the memory and for retrieving the data from the memory as a codeword representation that includes a plurality of soft bits, and a decoder of the present invention for decoding the codeword representation.

The scope of the present invention also includes a memory that includes an array of nonvolatile memory cells for storing a codeword and circuitry for decoding a representation of the codeword, as received from the array of nonvolatile memory cells, using one of the methods of the present invention. The scope of the present invention also includes a memory device that includes a nonvolatile memory for storing a codeword and a controller operative to receive a representation of the codeword from the volatile memory and to decode the representation of the codeword using one of the methods of the present invention. The scope of the present invention also includes a system that includes a memory device and a host, of the memory device, that is operative to receive a representation of a codeword from the memory device and to decode the representation of the codeword using one of the methods of the present invention. The scope of the present invention also includes a computer-readable storage medium having embodied thereon computer-readable code for implementing one of the methods of the present invention.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
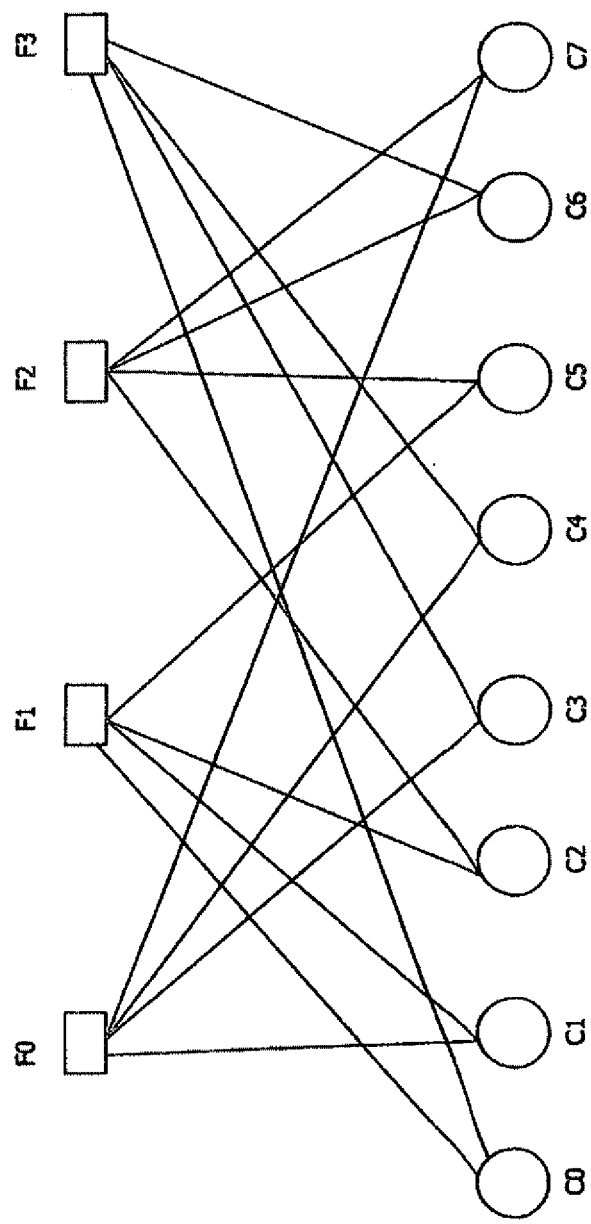
FIG. 1 illustrates a Tanner graph.
Figure 2:
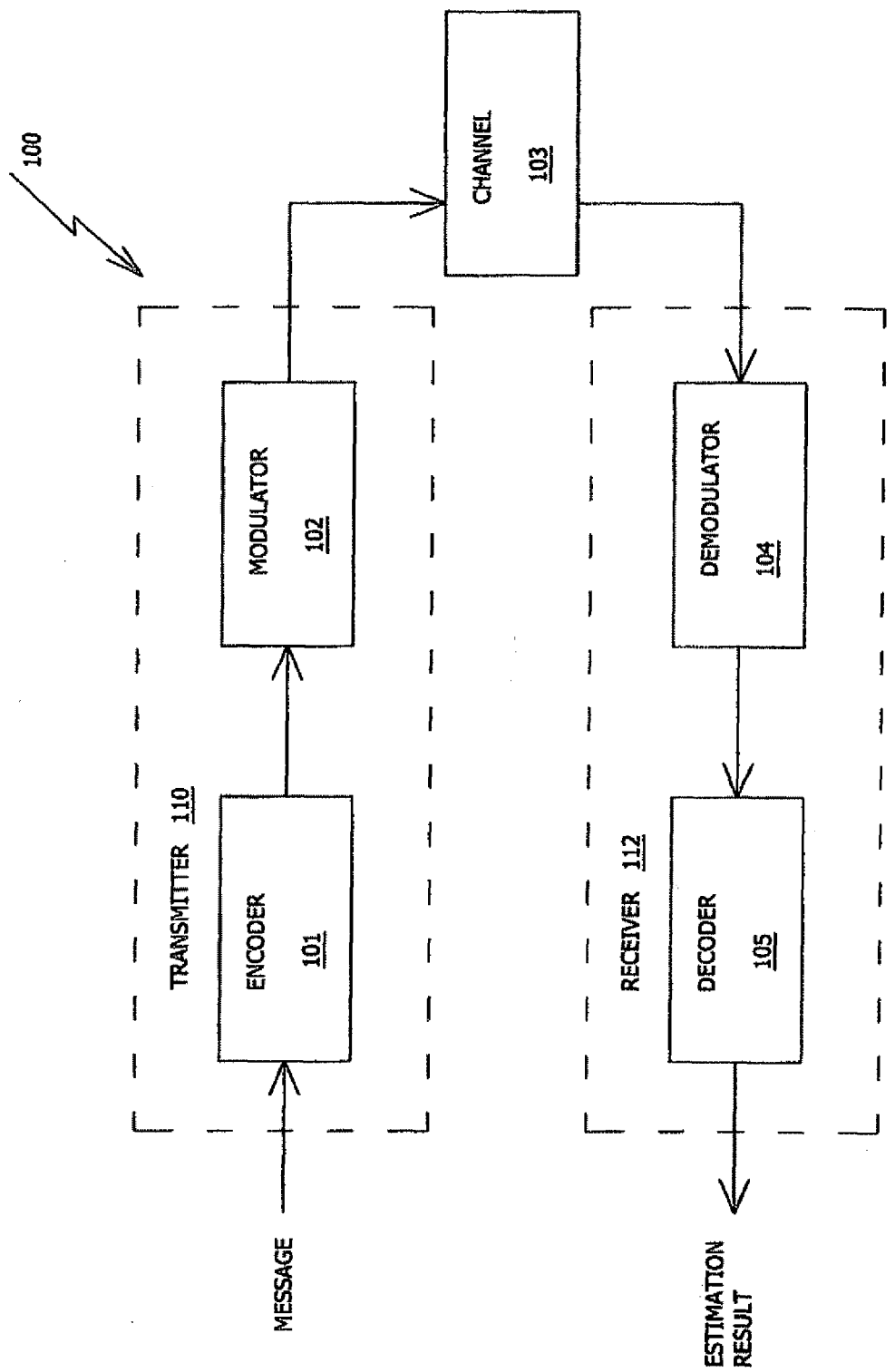
FIG. 2 is a block diagram of a communication system of the present invention.

The principles and operation of a lazy scheduling LDPC decoder according to the present invention may be better understood with reference to the drawings and the accompanying description.

The following is a detailed description of the lazy schedule decoding algorithm. At each iteration, the variable nodes are serially traversed in a given order. For each variable node $c_i$, the incoming and outgoing messages are updated with probability $\beta(l,r_i)$, where l is the iteration serial number and $r_i$ is some reliability measure of variable node c. Preferably, $\beta(l,r_i)$ is a function of the value of $r_i$ but not of the index i itself. Usually, $\beta(1,r_i)=1$ for all i. Note that if a flooding schedule is used and if the updating process is deterministic and independent of the iteration number, i.e. $\beta(l,r_i)=\beta(r_i)=0$ or 1 depending on if $r_i$ exceeds some threshold, we obtain the forced convergence algorithm as in P. K. Bora, E. Zimmermann, G. Fettweis and P. Pattisapu, "Reduced complexity LDPC decoding using forced convergence", *Seventh International Symposium on Wireless Personal Multimedia Communications (WPMC04)*, 2004).

A straightforward choice for the reliability measure $r_i$ is the a-posteriori LLR message magnitude $|Q_i|$. Indeed, this choice, referred to herein as LS-1, provides a significant complexity reduction. Unfortunately, theoretical analysis of LS-1 seems to be a hard problem. For that reason, we consider an alternative approach, referred to herein as LS-2, in which we use the a-priori LLR channel message magnitude $|P_i|$ as $r_i$. This choice, though rather non-optimal at the first sight, has several important advantages. For example, a theoretical analysis of LS-2 is possible. This enables optimization of the updating probabilities $\beta(l,r_i)$ without resorting to simulations. As shown below, LS-2 also provides a fair complexity reduction. This is not surprising because basing the updating decision on the value of $P_i$ is not really that bad, after all one can estimate the expected value of the a-posteriori message $E[Q_i]$ at iteration l based on the channel message $P_i$. LS-2 also has an implementation advantage because the decoding schedule is completely known when decoding starts.

The LS decoding algorithm is as follows:

Initialization
for all i and j: $T_{ij} \leftarrow \phi(P_i)$
for all j: $S_j \leftarrow \Sigma_{i \in N(j)} T_{ij}$, $R_{ji} \leftarrow \phi^{-1}(S_j - T_{ij})$
Iteration

```
for all i:
    execute with probability β(iteration, |Q_i| or |P_i|)
        Q_i ← P_i + Σ_{j∈N(i)} R_ji
        for all j∈N(i):
            S ← S_j - T_ij
            R_ji ← φ^{-1}(S)
            T_ij ← φ(Q_i - R_ji)
            S_j ← S + T_ij
        end of loop
    end condition
end of loop
```

In a generalization of the LS algorithm, updating probabilities $\beta(l, r_i, t_i)$ are used that also depend on a participation parameter $t_i$ such as the number of iterations that has passed since the last iteration in which variable node i participated. For example, each variable node can be forced to participate in at least every fourth iteration by having $\beta(l, r_i, t_i) = 1$ if $t_i = 4$.

A standard tool for asymptotic analysis of message passing decoding is the Density Evolution (DE) algorithm (T. J. Richardson and R. Urbanke, "The capacity of low-density parity-check codes under message passing decoding", *IEEE Trans. On Info. Theory* vol. 47 pp. 599-618, 2001). This tool is based on iterative calculation of the expected densities of messages passed by the decoder, assuming that the channel is memoryless and the underlying bipartite graph is asymptotically locally cycle-free. These assumptions can be used in order to show that, in certain scenarios, all incoming messages of a node are statistically independent, simplifying the analysis tremendously. Unfortunately, for LS-1 this is not the case because LS-1 introduces complex statistical dependencies that make DE analysis intractable. These statistical dependencies are caused by the serial scheduling that is used, as well as by the dependency of the updating probability $\beta(l, |Q_j|)$ on the a-posteriori LLR message.

We solve these problems by limiting the analysis to LS-2 in which the updating probability is a function of the a-priori LLR message. Moreover, we assume that the LS is based on a semi-serial scheduling instead of the serial scheduling. In the semi-serial scheduling, subsets of variable nodes are serially updated, while the messages of variable nodes in a subset are updated in parallel. As shown by Sharon et al., properly defined semi-serial scheduling is amenable to DE analysis. We follow this definition. In order to generate a semi-serial schedule we choose independently for each variable node an integer from 1 through M randomly with equal probability. This is the number of the subset to which the variable node belongs. The subsets are updated serially according to their subset number. As the number of subsets M increases the semi-serial schedule's expected convergence rate becomes very close to the expected convergence rate of the serial schedule. In the simulation presented below, M=100.

To derive the DE equations we use an approach similar to Richardson and Urbanke. Let $f_P$, $f_Q^{(l)}$, $f_{Qm}^{(l)}$ and $f_{Rm}^{(l)}$ stand correspondingly for the expected probability density functions (pdf) of a channel message $P_i$, a variable-to-check message $Q_{ij}$ at the l'th iteration, a variable-to-check message $Q_{ij}$ sent from a variable node belonging to the m'th subset at the l'th iteration and a check-to-variable message $R_{ji}$ sent to a variable node belonging to the m'th subset at the l'th iteration. All pdfs are conditioned on the assumption that the zero codeword is transmitted. The expectation is taken over all graph edges, all tree-like graphs from the ensemble, all semi-serial schedules and all decoder inputs. Then, the expected variable-to-check message pdf is given by:

$$f_{Qm}^{(l)}(q) = \int_{-\infty}^{\infty} f_P(p)(\beta(l, |p|)\lambda(f_{Rm}^{(l)})(q-p) + (1 - \beta(l, |p|))f_Q^{(l-1)}(q))dp$$

$$f_{Qm}^{(0)} = f_P \quad m = 1, \ldots, M$$

$$f_Q^{(l)} = \frac{1}{M}\sum_{m=1}^{M} f_{Qm}^{(l)}$$

where $$\lambda(f) = \sum_{j=2}^{w_c} \lambda_j \otimes^{j-1} f,$$

$w_c$ is the maximum number of 1's in any column of the parity-check matrix and $\otimes$ denotes convolution. The expected check-to-variable message pd is given by:

$$f_{Rm}^{(l)} = \Gamma^{-1}\left(\rho\left(\Gamma\left(\frac{1}{M}\left(\sum_{k=1}^{m-1} f_{Qk}^{(l)} + \sum_{k=m}^{M} f_{Qk}^{(l-1)}\right)\right)\right)\right)$$

where $\Sigma$ is defined so that for a real random variable X with density $f_X$, the density of $\phi(X)$ is $\Gamma(f_X)$, $$\rho(f) = \sum_{j=2}^{w_r} \rho_j \otimes^{j-1} f$$

and $w_r$ is the maximum number of 1's in any row of the parity-check matrix. Note that here the convolution is taken over the group F2×[0,∞].

Using the DE analysis we can optimize the updating probabilities $\beta(l,|p|)$ in order to minimize the decoding complexity function and ensure that no artificial inherent error floor is introduced by LS. While the DE analysis is asymptotic, the actual decoding complexity is affected by the code's finite length N. Hence, we use the following approximate finite length Normalized Decoding Complexity (NDC) function for optimization of $\beta(l,|p|)$:

$$NDC = \sum_{l=1}^{\infty} P_B^{(l)} \cdot C^{(l)}$$

where $P_B^{(l)} \cong 1-(1-P_b^{(l-1)})^N$ is an approximation of the expected fraction of codewords that have not yet been decoded by the time the algorithm reaches decoding iteration l, $$P_b^{(l)} = \int_{-\infty}^{0} f_Q^{(l)}(q)dq$$

is the expected BER after the l-th iteration and $$C^{(l)} = \int_{-\infty}^{\infty} f_P(p)\beta(l, |p|)dp$$

is the expected cost of decoding iteration l. The sum is terminated when $P_B^{(l)}$ falls below a predetermined threshold.

In practice we used quantized updating probabilities $\beta(l,|p|)$ with 16 possible values equally dividing the channel LLR message magnitude into equally spaced bins. Because for LS-1 the DE analysis is intractable, we used instead simulations to approximately model the expected behavior of the decoder and then performed similar optimization for the updating probabilities. In other words, we simulated the decoder using several trial updating probability functions and chose the function that gave the lowest decoding complexity.

Figure 3:
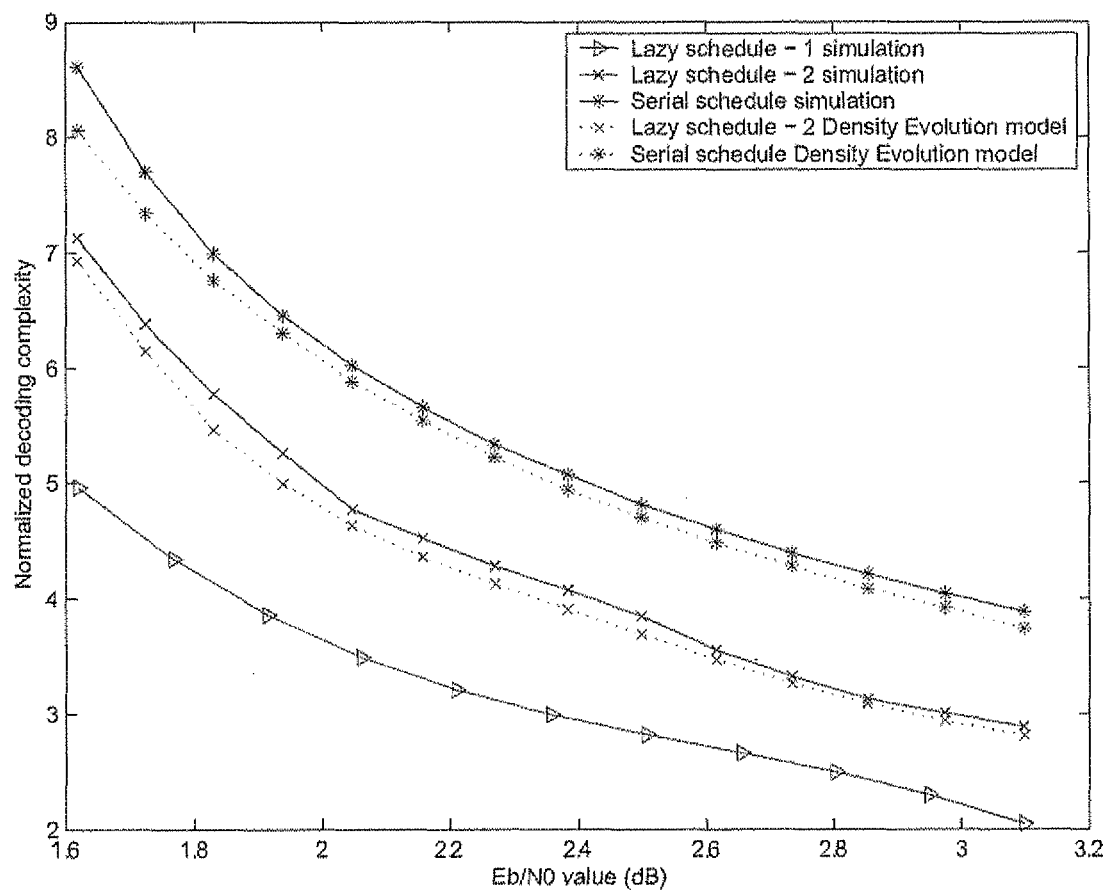
FIG. 3 is a graph of normalized decoding complexities of three decoding schemes of the present invention vs. two prior art decoding schemes.

In our simulation we used regular (3,6) LDPC codes of length $10^4$. LS introduces no performance degradation compared to flood or serial scheduling when the maximal number of iterations used is high. Even with limited number of iterations, performance degradation is negligible (less than 0.1 dB). Referring again to is the Figures, FIG. 3 shows simulation and theoretical DE results for the BiAWGN channels. (A BiAWGN channel is a binary input additive white Gaussian noise channel, i.e., an additive white Gaussian noise channel with BPSK modulation.) The curves show the normalized decoding complexity of various schemes as a function the channel's SNR. The maximal number of decoding iterations is set to 50, hence all schemes provide the same BER performance. The complexity reduction of LS depends on the channel SNR conditions. LS-1 provides complexity reduction of 40-50% compared to the serial schedule and 70-75% complexity reduction compared to the flooding schedule. LS-2 provides complexity reduction of 20-25% compared to the serial schedule and 60-62.5% complexity reduction compared to the flooding schedule. In comparison, the forced convergence decoder of P. K. Bora, E. Zimmerman, G. Fettweis and P. Pattisapu, "Reduced complexity LDPC decoding using forced convergence", *Seventh International Symposium on Wireless Personal Multimedia Communications* (*WPMC*04), 2004 provides only up to 35% complexity reduction compared to the flooding schedule without performance loss.

Figure 4:
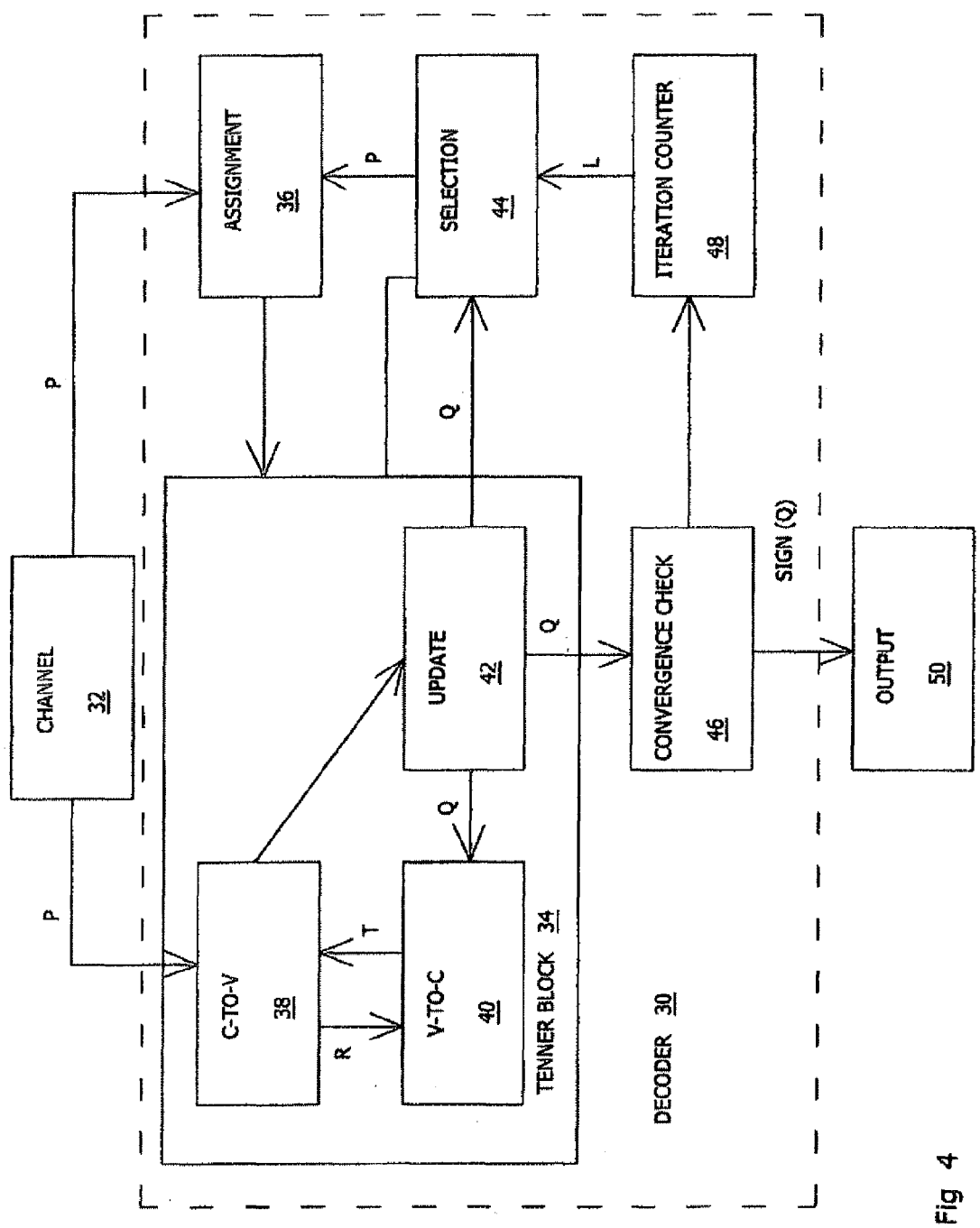
FIG. 4 is a block diagram of a generalized decoder of the present invention.

The present invention may be implemented in hardware, firmware or software, or in a combination thereof. FIG. 4 is a functional block diagram of a generalized decoder 30 of the present invention. The functional blocks of FIG. 4 may be implemented in hardware, firmware, software or a combination thereof. FIG. 4 also serves as a flow chart of a preferred embodiment of the method of the present invention.

Decoder 30 receives a codeword, in the form of a set of soft bits $\{P_i\}$, from a noisy channel 32. An assignment module 36 assigns each soft bit to a respective variable node. At the start of each decoding iteration, a selection module 44 selects which variable nodes are to participate in this decoding iteration, according to the iteration number l and according to either the input soft bits $\{P_i\}$ (LS-2) or the values of the soft bits $\{Q_i\}$ at the start of this decoding iteration (LS-1). A Tanner graph module block 34, that includes a check-node-to-variable-node-module 38, an update module 42 and a variable-node-to-check-node module 40, receives the variable node assignments from assignment module 36 and the variable node selections from selection module 44. Check-node-to-variable-node module 38 computes, for each check node j, the messages $R_{ji}$ to send to the participating variable nodes i that are connected to that check node j, and sends the messages $R_{ji}$ to their respective variable nodes. Update module 42 updates the soft bits $Q_i$ of the participating variable nodes i according to the messages $R_{ji}$ that those variable nodes have received from their check nodes in the current decoding iteration. Variable-node-to-check-node module 40 computes, for each participating variable node i, the messages $T_{ij}$ to send to the check nodes j that are connected to that variable node i and sends the messages $T_{ij}$ to their respective check nodes. Note that a check node computes its check-node-to-variable-node messages on the basis of the variable-node-to-check-node messages received most recently from all the variable nodes to which that check node is connected, whether or not those variable nodes are participating in the current decoding iteration. A convergence check module 46 determines whether the current decoding iteration has converged. If the current decoding iteration has converged, convergence check module 46 outputs a decoded codeword 50. Otherwise, convergence check module 46 increments l in an iteration counter 48 and decoder 30 proceeds to the next decoding iteration.

Figure 5:
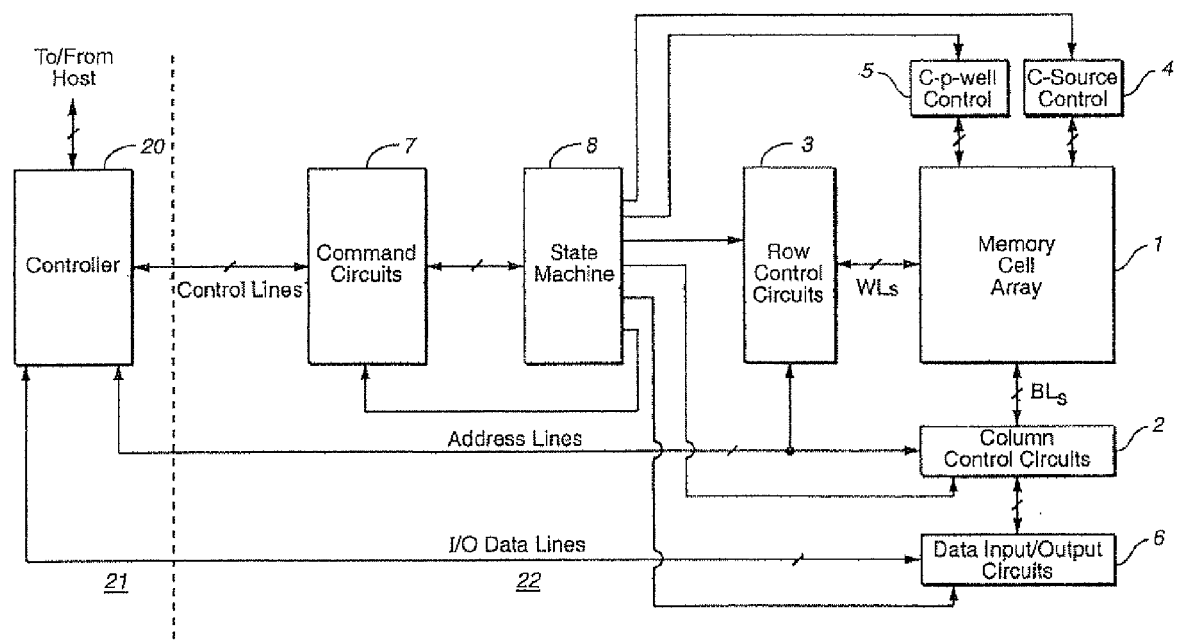
FIG. 5 is a block diagram of a flash memory device of the present invention.

FIG. 5, which is taken from FIG. 1 of Chen et al., U.S. Pat. No. 6,522,580, is a block diagram of a flash memory device of the present invention. A memory cell array 1 including a plurality of memory cells M arranged in a matrix is controlled by column control circuitry 2, a row control circuit 3, a c-source control circuit 4 and a c-p-well control circuit 5. Column control circuitry 2 is connected to bit lines (BL) of memory cell array 1 for reading data stored in the memory cells (M), for determining a state of the memory cells (M) during a program operation, and for controlling voltage levels of the bit lines (BL) to promote the programming or to inhibit the programming. Row control circuit 3 is connected to word lines (WL) to select one of the word lines (WL), to apply read voltages, to apply programming voltages combined with the bit line voltage levels controlled by column control circuitry 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage. Typically, in a NAND flash device, the cells controlled by one word line correspond to one or two pages of the device.

The data stored in the memory cells (M) are read out by column control circuitry 2 and are output to external I/O lines via an I/O line and a data input/output buffer 6. Program data to be stored in the memory cells are input to data input/output buffer 6 via the external I/O lines, and are transferred to column control circuitry 2. The external I/O lines are connected to a controller 20.

Command data for controlling the flash memory device are input to a command interface connected to external control lines that are connected with controller 20. The command data informs the flash memory of what operation is requested. The input command is transferred to a state machine 8 that controls column control circuitry 2, row control circuit 3, c-source control circuit 4, cp-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host that initiates commands, such as to store or read data to or from memory array 1, and provides or receives such data, respectively. Controller 20 converts such commands into command signals that can be interpreted and executed by command circuits 7. Controller 20 also typically contains buffer memory for the user data being written to or read from memory array 1. A typical memory device includes one integrated circuit chip 21 that includes controller 20, and one or more integrated circuit chips 22 that each contain a memory array and associated control, input/output and state machine circuits. The trend, of course, is to integrate the memory array and controller circuits of a device together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

The data that are stored in memory array 1 are encoded as threshold voltages of memory cells M. The threshold voltage of a memory cell corresponds to a symbol that represents the values of one or more bits. The set of such symbols constitutes a signal constellation analogous to the signal constellations of communication systems. Column control circuitry 2 transforms the threshold voltages of memory cells M being read to LLRs of the bits stored in the cells, just as the circuitry of a digital receiver transforms received symbols into LLRs of the received bits. U.S. patent application Ser. No. 11/642,708, filed Dec. 21, 2006, includes an example of how to read threshold voltages of single-bit-per-cell flash cells as LLRs.

In some preferred embodiments of a flash memory device of the present invention, column control circuitry 2 also includes circuits for LDPC encoding of data as codewords to be stored in memory array 1 and circuits for LDPC decoding, according to the method of the present invention, of possibly erroneous codewords as read from memory array 1. In other preferred embodiments of a flash memory device of the present invention, controller 20 performs the LDPC encoding of data as codewords to be stored in memory array 1 and the LDPC decoding, according to the method of the present invention, of possibly erroneous codewords as read from memory array 1. In both such embodiments, the "channel"[7] from which the decoding circuitry of command circuits 7 receives the codewords to be decoded is the combination of memory array 1 and data input/output buffer 6.

Figure 6:
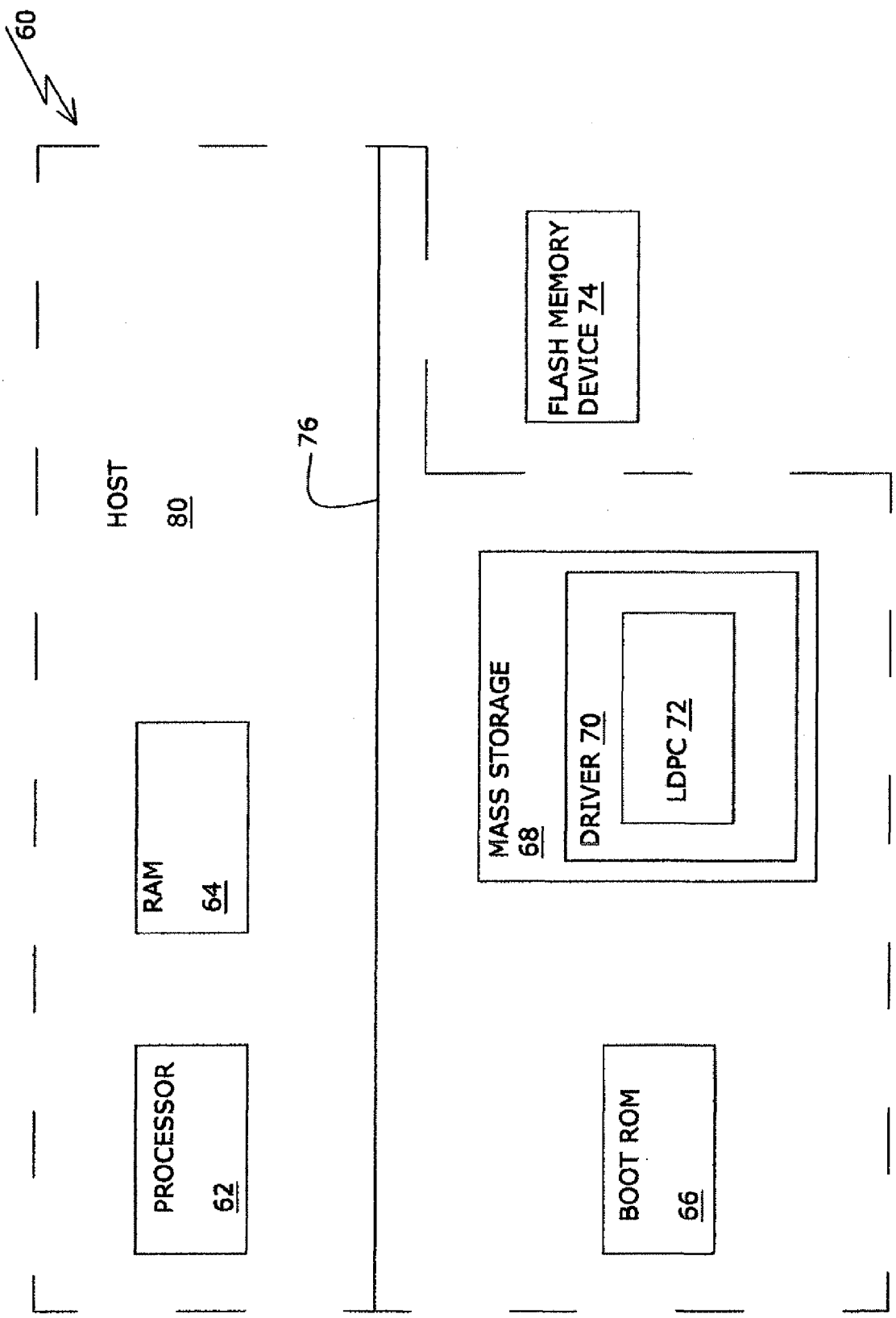
FIG. 6 is a block diagram of a system of the present invention.

FIG. 6 is a high-level block diagram of a system 60 of the present invention. System 60 includes a processor 62 and four memory devices: a RAM 64, a boot ROM 66, a mass storage device (hard disk) 68 and a prior art flash memory device 74, all communicating via a common bus 76. A software driver 70 of flash memory device 74 is stored in mass storage device 68 and is executed by processor 62 to access flash memory device 74. Driver 70 includes a LDPC module 72 for encoding data to be stored in flash memory device 74, and for decoding codewords received from flash memory device 94 using the methodology of the present invention. In system 60, the "channel" through which the codewords to be decoded are received by processor 62 includes flash memory device 74 itself and bus 76.

In FIG. 6, the components of system 60 other than flash memory device 74 constitute a host 80 of flash memory device 74. Mass storage device 68 is an example of a computer-readable storage medium bearing computer-readable code for implementing the present invention. Other examples of such computer-readable storage media include read-only memories such as CDs bearing such code.

Figure 7:
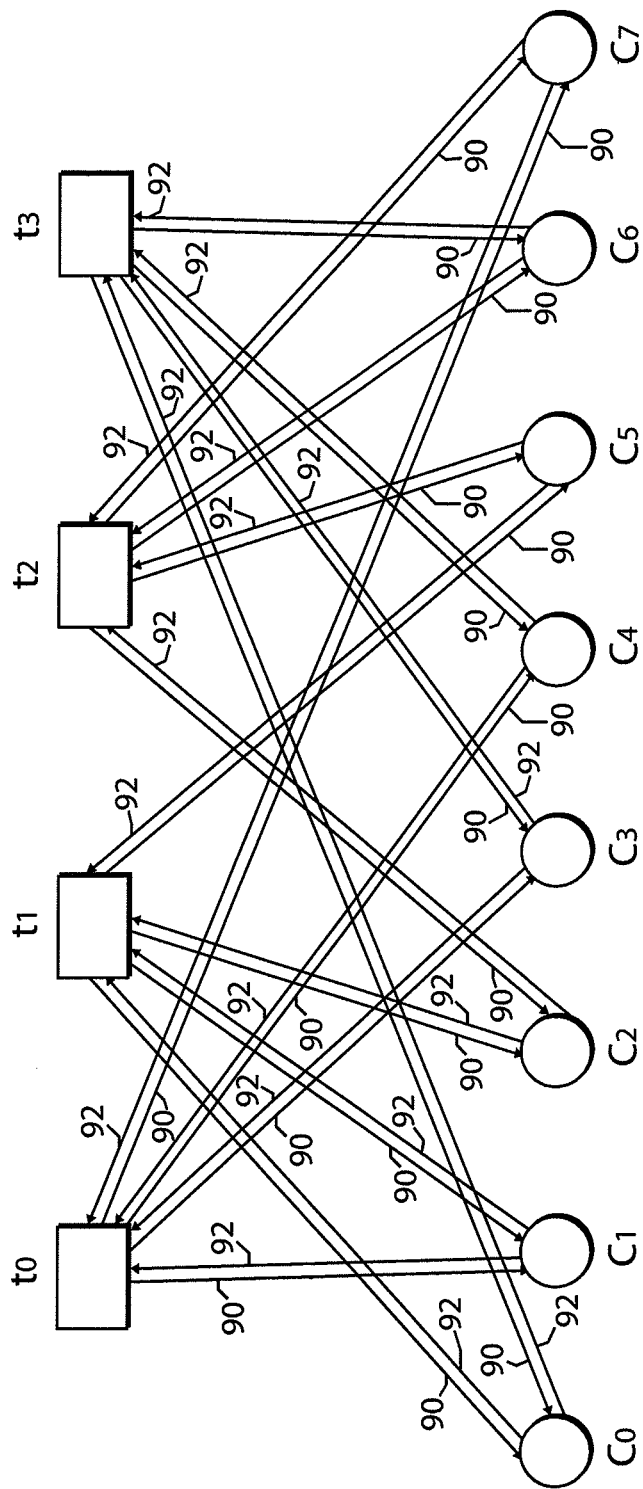
FIG. 7 illustrates a directed Tanner graph.

A generalization of the lazy schedule decoding algorithm uses a "directed" Tanner graph. In a directed Tanner graph, each variable node is connected to each of its check nodes by two edges, a variable node edge and a check node edge. Messages are passed along variable node edges from their respective variable nodes to their respective check nodes. Messages are passed along check node edges from their respective check nodes to their respective variable nodes. FIG. 7 shows how the Tanner graph of FIG. 1 is modified to produce a directed Tanner graph. Each variable node $c_i$ is connected to each of its check nodes $f_j$ by two edges: a variable node edge 90 that points from $c_i$ to $f_j$ and a check node edge 92 that points from $f_j$ to $c_i$.

The message passing decoding schedule is established by creating an ordered list of the edges. For example, the order for the flooding schedule is:

variable node edges of variable node $c_1$
$\vdots$
variable node edges of variable node $c_n$
check node edges of variable node $c_1$
$\vdots$
check node edges of variable node $c_n$ and the order for the serial schedule of Sharon et al. is:

variable node edges of variable node $c_1$
check node edges of variable node $c_1$
variable node edges of variable node $c_2$
check node edges of variable node $c_2$
$\vdots$
variable node edges of variable node $c_n$
check node edges of variable node $c_n$ In each decoding iteration, the list of edges is traversed, and it is decided separately, for each edge, according to one or more selection criteria similar to the selection criteria used above for variable nodes, whether that edge is to participate in the current decoding iteration by having one or more messages passed along that edge. In one set of embodiments of this variant of the present invention, the participation of an edge is probabilistically conditional on a reliability number related to the edge. For example, $|Q_i|$ is a measure of how sure variable node $c_i$ is of its current estimate $Q_i$ of soft bit i. Similarly, the message $Q_{ij}$ that is sent from variable node $c_i$ to check node $f_j$ along the variable node edge 90 that points from variable node $c_i$ to check node $f_j$ is the current estimate of soft bit i based on the messages that variable node $c_i$ has received most recently from all of its check nodes except for check node $f_j$, so that $|Q_{ij}|$ is a measure of how sure variable node $c_i$ node $f_j$ is of $Q_i$. Similarly, the message $R_{ji}$ that is sent from check node $f_j$ to variable node $c_i$ along the check node edge 92 that points from check node $f_j$ to variable node $c_i$ is check node $f_j$'s current proposed correction to soft bit i, so that $|R_{ji}|$ is a measure of how sure check node $f_j$ is of its proposed correction to $Q_i$. Similarly, $|S_j|$ is a measure of the reliability of check node $f_j$, i.e., a measure of the collective reliability of the current soft bit estimates of all the variable nodes that are connected to check node $f_j$. Intuitively, the higher these magnitudes, the less necessary it is to send messages along the associated edges in the current decoding iteration. For example, the higher $|Q_i|$, the less need to update $Q_i$ in the current decoding iteration.

Other selection criteria include functions of the serial number of the decoding iteration, e.g., restricting even-numbered decoding iterations to even-numbered edges and restricting odd-numbered decoding iterations to odd-numbered edges, and functions of edge participation histories, e.g., forcing an edge to participate if that edge has not participated in the five most recent decoding iterations.

Preferably, messages of two or more edges are passed in parallel. Method of parallel implementation are well-known in the art. For example, Sharon et al. used a parallelized implementation of their serial schedule. In practical applications, parallelization usually is required to achieve the required high throughput.

While the invention has been described with respect to a limited number of embodiments, it will be appreciated that many variations, modifications and other applications of the invention may be made.

What is claimed is:

1. A decoder for decoding a codeword representation that includes a plurality of soft bits, the decoder comprising a plurality of functional modules for updating the soft bits in at least one decoding iteration, it being decided in accordance with a selection criterion, in each said decoding iteration, for each soft bit, whether said each soft bit participates in said each decoding iteration, wherein said selection criterion is that each said soft bit participates in each said decoding iteration with a probability that is a function of an argument, the argument comprising at least one of a serial number of said each decoding iteration or a participation history of said each soft bit.

2. The decoder of claim 1, wherein said plurality of functional modules include:
   (a) a variable node assignment module for assigning each soft bit to a respective variable node, so that it is decided in accordance with said selection criterion, for each said variable node, whether said each variable node participates in said each decoding iteration;
   (b) a variable node selection module for determining, in each said decoding iteration, which said variable nodes participate in said each decoding iteration;
   (c) a first message passing module for, in each said decoding iteration, computing, for each said participating variable node, for each member of a respective subplurality of a plurality of check nodes, a respective check-node-to-variable-node message;
   (d) a soft bit update module for, in each said decoding iteration, updating the respective soft bit of each said participating variable node in accordance with said check-node-to-variable-node messages received in said each decoding iteration from said first message passing module; and
   (e) a second message passing module for, in each said decoding iteration, for each said participating variable node, computing, according to said check-node-to-variable-node messages thereof that have been most recently received from said first message passing module, a respective variable-node-to-check-node message for each said check node in said respective subplurality of check nodes of said each participating variable node.

3. The decoder of claim 1, wherein said plurality of functional modules further includes a convergence check module for deciding, responsive to said updating, whether the decoding has converged.

4. A memory comprising:
   (a) an array of nonvolatile memory cells for storing a codeword; and
   (b) circuitry configured to decode a representation of said codeword received from said array of nonvolatile memory cells, said representation including a plurality of soft bits, by updating said soft bits in at least one decoding iteration, it being decided in accordance with a selection criterion, in each said decoding iteration, for each said soft bit, whether said each soft bit participates in said each decoding iteration, wherein said selection criterion is that each said soft bit participates in each said decoding iteration with a probability that is a function of an argument, the argument comprising at least one of a serial number of said each decoding iteration or a participation history of said each soft bit.

5. The memory of claim 4, wherein the circuitry configured to decode said representation of said codeword comprises:
   (a) variable node assignment circuitry configured to assign each soft bit to a respective variable node, so that it is decided in accordance with said selection criterion, for each said variable node, whether said each variable node participates in said each decoding iteration;
   (b) variable node selection circuitry configured to determine, in each said decoding iteration, which said variable nodes participate in said each decoding iteration;
   (c) first message passing circuitry configured, in each said decoding iteration, to compute, for each said participating variable node, for each member of a respective subplurality of a plurality of check nodes, a respective check-node-to-variable-node message;
   (d) soft bit update circuitry configured, in each said decoding iteration, to update the respective soft bit of each said participating variable node in accordance with said check-node-to-variable-node messages received in said each decoding iteration from said first message passing module; and
   (e) second message passing circuitry configured, in each said decoding iteration, for each said participating variable node, to compute, according to said check-node-to-variable-node messages thereof that have been most recently received from said first message passing module, a respective variable-node-to-check-node message for each said check node in said respective subplurality of check nodes of said each participating variable node.

6. A memory device, comprising:
   (a) a nonvolatile memory for storing a codeword; and
   (b) a controller operative to receive a representation of said codeword from said nonvolatile memory, said representation including a plurality of soft bits, and to decode said representation of said codeword by updating said soft bits in at least one decoding iteration, it being decided in accordance with a selection criterion, in each said decoding iteration, for each said soft bit, whether said each soft bit participates in said each decoding iteration, wherein said selection criterion is that each said soft bit participates in each said decoding iteration with a probability that is a function of an argument, the argument comprising at least one of a serial number of said each decoding iteration or a participation history of said each soft bit.

7. A system comprising:
   (a) a memory device; and
   (b) a host, of said memory device, that is operative to receive a representation of a codeword from said memory device, said representation including a plurality of soft bits, and to decode said representation of said codeword by updating said soft bits in at least one decoding iteration, it being decided in accordance with a selection criterion, in each said decoding iteration, for each said soft bit, whether said each soft bit participates in said each decoding iteration, wherein said selection criterion is that each said soft bit participates in each said decoding iteration with a probability that is a function of an argument, the argument comprising at least one of a serial number of said each decoding iteration or a participation history of said each soft bit.

8. A decoder for decoding a codeword representation that includes a plurality of soft bits, the decoder comprising a plurality of functional modules for updating the soft bits in at least one decoding iteration, it being decided in accordance with a selection criterion, in each said decoding iteration, for each soft bit, whether said each soft bit participates in said each decoding iteration, wherein said selection criterion favors participation of less reliable soft bits over participation of more reliable soft bits, and wherein a probability of participation of each soft bit is a function of an argument, the argument comprising at least one of a serial number of said each decoding iteration or a participation history of said each soft bit.

9. A memory comprising:
    (a) an array of nonvolatile memory cells for storing a codeword; and
    (b) circuitry configured to decode a representation of said codeword received from said array of nonvolatile memory cells, said representation including a plurality of soft bits, by updating said soft bits in at least one decoding iteration, it being decided in accordance with a selection criterion, in each said decoding iteration, for each said soft bit, whether said each soft bit participates in said each decoding iteration, wherein said selection criterion favors participation of less reliable soft bits over participation of more reliable soft bits, and wherein a probability of participation of each soft bit is a function of an argument, the argument comprising at least one of a serial number of said each decoding iteration or a participation history of said each soft bit.

10. A memory device, comprising:
    (a) a nonvolatile memory for storing a codeword; and
    (b) a controller operative to receive a representation of said codeword from said nonvolatile memory, said representation including a plurality of soft bits, and to decode said representation of said codeword by updating said soft bits in at least one decoding iteration, it being decided in accordance with a selection criterion, in each said decoding iteration, for each said soft bit, whether said each soft bit participates in said each decoding iteration, wherein said selection criterion favors participation of less reliable soft bits over participation of more reliable soft bits, and wherein a probability of participation of each soft bit is a function of an argument, the argument comprising at least one of a serial number of said each decoding iteration or a participation history of said each soft bit.

11. A system comprising:
    (a) a memory device; and
    (b) a host, of said memory device, that is operative to receive a representation of a codeword from said memory device, said representation including a plurality of soft bits, and to decode said representation of said codeword by updating said soft bits in at least one decoding iteration, it being decided in accordance with a selection criterion, in each said decoding iteration, for each said soft bit, whether said each soft bit participates in said each decoding iteration, wherein said selection criterion favors participation of less reliable soft bits over participation of more reliable soft bits, and wherein a probability of participation of each soft bit is a function of an argument, the argument comprising at least one of a serial number of said each decoding iteration or a participation history of said each soft bit.

* * * * *